(12) United States Patent
Ueno

(10) Patent No.: US 8,018,264 B2
(45) Date of Patent: *Sep. 13, 2011

(54) INTERFACE CIRCUIT

(75) Inventor: Tatsuya Ueno, Tokyo (JP)

(73) Assignee: Yamatake Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/797,123

(22) Filed: Jun. 9, 2010

(65) Prior Publication Data

US 2011/0133775 A1 Jun. 9, 2011

Related U.S. Application Data (63) Continuation of application No. 12/794,434, filed on Jun. 4, 2010, now Pat. No. 7,986,162, which is a continuation of application No. 11/792,993, filed on Jun. 13, 2007, now Pat. No. 7,750,705.

(51) Int. Cl.
*H03K 3/02* (2006.01)

(52) U.S. Cl. ............. 327/198; 326/33; 326/58; 326/81; 326/86; 327/109; 365/189.05; 365/230.08

(58) Field of Classification Search ............. 326/21–23, 326/26–27, 31, 33–34, 56–58, 80–83, 86; 327/108–109, 198, 333; 365/189.05, 230.08
See application file for complete search history.

(56) References Cited

U.S. PATENT DOCUMENTS

| | | | |
|---|---|---|---|
| 5,432,462 A | | 7/1995 | Obregon et al. |
| 5,598,106 A | | 1/1997 | Kawasaki et al. |
| 5,646,553 A | * | 7/1997 | Mitchell et al. .................. 326/86 |
| 5,828,233 A | * | 10/1998 | Nguyen et al. .................. 326/86 |
| 5,914,844 A | * | 6/1999 | Lutley et al. .................. 361/111 |
| 5,936,447 A | * | 8/1999 | Haigis ............. 327/198 |
| 5,973,530 A | * | 10/1999 | Morris et al. .................. 327/210 |
| 6,049,242 A | * | 4/2000 | Lutley et al. .................. 327/333 |
| 6,144,251 A | | 11/2000 | Ogawa |

(Continued)

FOREIGN PATENT DOCUMENTS

JP 59-002409 A 1/1984

(Continued)

OTHER PUBLICATIONS

AN-5006J Designing With Bushold; Fairchild Semiconductor Corporation; Sep. 1999; pp. 1-3.

(Continued)

*Primary Examiner* — Jason M Crawford (74) *Attorney, Agent, or Firm* — Amster, Rothstein & Ebenstein, LLP (57) ABSTRACT

An interface of the present invention includes a first inverter circuit that inverts a logic level of an input signal given to an external input terminal and outputs the inverted logic level, a second inverter circuit that outputs a potential in which a logic level of an output signal of the first inverter circuit is inverted, that is, a potential higher or lower than a logic of an input signal applied to the first inverter circuit by the amount of a predetermined potential, and a feedback path that positive feedbacks an output signal of the second inverter circuit to the external input terminal. The interface circuit of the invention positive-feedbacks a potential of the output signal of the second inverter circuit and shifts the potential of the external input terminal in a floating state to an H or L level potential.

19 Claims, 8 Drawing Sheets

U.S. PATENT DOCUMENTS

| | | | |
|---|---|---|---|
| 6,150,845 A * | 11/2000 | Morrill | 326/81 |
| 6,184,715 B1 * | 2/2001 | Catanzaro et al. | 326/81 |
| 6,211,702 B1 | 4/2001 | Morrill | |
| 6,222,387 B1 * | 4/2001 | Meng et al. | 326/83 |
| 6,351,174 B2 | 2/2002 | Soltero et al. | |
| 6,351,175 B1 * | 2/2002 | Rapp | 327/415 |
| 6,774,675 B1 * | 8/2004 | Miske et al. | 326/81 |
| 7,064,593 B2 * | 6/2006 | Hinterscher et al. | 327/198 |
| 7,205,809 B2 * | 4/2007 | McCaughey et al. | 327/199 |
| 7,750,705 B2 * | 7/2010 | Ueno | 327/198 |
| 2003/0189865 A1 * | 10/2003 | Ausserlechner et al. | 365/200 |

FOREIGN PATENT DOCUMENTS

| | | |
|---|---|---|
| JP | 61-237515 A | 10/1986 |
| JP | 05-259880 A | 10/1993 |
| JP | 06-112807 A | 4/1994 |
| JP | 07-273633 A | 10/1995 |
| JP | 07-321334 A | 12/1995 |
| JP | 09-161486 A | 6/1997 |
| JP | 11-317656 A | 11/1999 |
| JP | 2000-003237 A | 1/2000 |
| JP | 2001-042980 A | 2/2001 |

OTHER PUBLICATIONS

Japanese Office Action dated Oct. 27, 2006 and English translation thereof issued in a counterpart Japanese Application No. 2003-188027.

* cited by examiner

PMOS

NMOS

|  | THIRD STAGE β | | | | | |
|---|---|---|---|---|---|---|
| SECOND STAGE α | | PMOS | P-D | N-D | NMOS | P-R | N-R |
| | PMOS | × | × | × | ○ | ○ | ○ |
| | P-D | × | × | × | ○ | ○ | ○ |
| | N-D | × | × | × | ○ | ○ | ○ |
| | NMOS | ○ | ○ | ○ | × | ○ | ○ |
| | P-R | ○ | ○ | ○ | ○ | ○ | ○ |
| | N-R | ○ | ○ | ○ | ○ | ○ | ○ |

INTERFACE CIRCUIT

CROSS-REFERENCE TO RELATED APPLICATIONS

This patent application is a continuation of co-pending U.S. patent application Ser. No. 12/794,434, filed on Jun. 4, 2010, which is now U.S. Pat. No. 7,986,162 issued on Jul. 26, 2011, which is a continuation of U.S. patent application Ser. No. 11/792,993, filed on Jun. 13, 2007, which is now U.S. Pat. No. 7,750,705 issued on Jul. 6, 2010, and which was filed as a U.S. National Stage Application under 35 U.S.C. § 371 of International Application PCT/JP2004/019396, filed Dec. 24, 2004.

TECHNICAL FIELD

The present invention relates to an interface circuit that is applied to various kinds of electronic devices and stabilizes an electrical state of external input/output terminals.

BACKGROUND ART

In general, a signal transmitted by a device in a digital system basically has two states aside from a floating state. The first state is designed to transmit a phenomenon corresponding to a logic high level (also called "logic high", "High", "1", "ON" or "H level"). The second state is designed to transmit a phenomenon corresponding to a logic low level (also called "logic low", "Low", "0", "OFF" or "L level").

A particular signal potential that determines which of a logic high signal and a logic low signal is being transmitted depends upon a semiconductor device that forms a circuit related to the transmission.

For example, the most common circuit configurations used to produce a digital signal include a CMOS logic IC and a transistor-transistor logic (TTL) IC. In the CMOS logic IC, the logic low signal generally falls in a range of from a potential applied to a low-voltage terminal to a potential that is about 0.6 V higher than that applied to the low-voltage terminal, whereas the logic high signal is generally set in a range of from Vcc to Vcc-0.6 V if a potential applied to a high-voltage terminal is Vcc. As it is a well-known technical matter that a relationship between a signal potential and a logic level is determined depending on a device, this technical matter will not be specifically described below.

All sorts of data processing systems functioning as digital systems are usually provided with a plurality of external input terminals (a connector) for signal input. A plurality of input terminals (pins) for signal input are provided to a semiconductor integrated circuit such as a CPU which is installed in a data processing system. Sometimes a control terminal for switching operation modes of a CPU or the like is further provided to the semiconductor integrated circuit. The external input terminal has a function as an interface that inputs a logic signal having an H or L level, which is given from an external device, to transmit the signal to an internal circuit, such as a CPU and a memory. The control terminal has a function to switch the control information to be given to the internal circuit between the H and L levels, for example, depending upon whether it is grounded or not.

This kind of the external input terminal or the control terminal for a logic circuit has a high input impedance. For this reason, the potential is liable to be varied due to outside noise in a floating state. In order to avoid the influence of the outside noise even when the potential of the external input terminal is in the floating state, in conventional art, an external input terminal 1 is generally connected to a power source voltage Vcc through a pull-up resistor Rpu or alternatively grounded through a pull-down resistor Rpd as illustrated in FIGS. 13A and 13B.

Figure 13A:
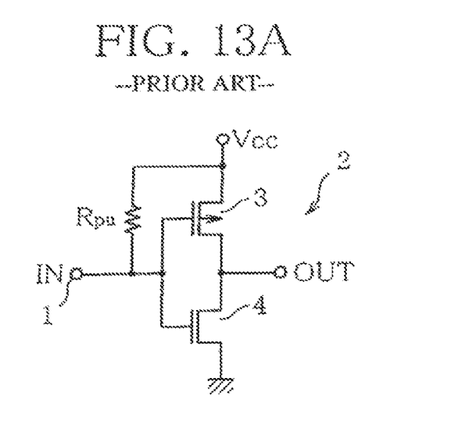
FIG. 13A is a configuration view showing an example of processing of an external input terminal using a pull-up resistor Rpu.
Figure 13B:
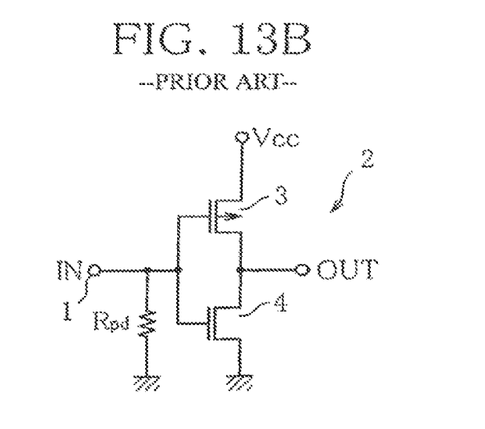
FIG. 13B is a configuration view showing an example of processing of the external input terminal using a pull-down resistor Rpd.

An input buffer 2 having the external input terminal 1 is formed of an inverter circuit made up of a p-channel MOS transistor (abbreviated to "PMOS") 3 and an n-channel MOS transistor (abbreviated to "NMOS") 4, for example, as illustrated in FIGS. 13A and 13B. However, when the external input terminal 1 is connected with the pull-up resistor Rpu or the pull-down resistor Rpd, a leakage current sometimes flows into the external input terminal 1 using the resistor Rpu or Rpd as a course of the current.

Figure 14:
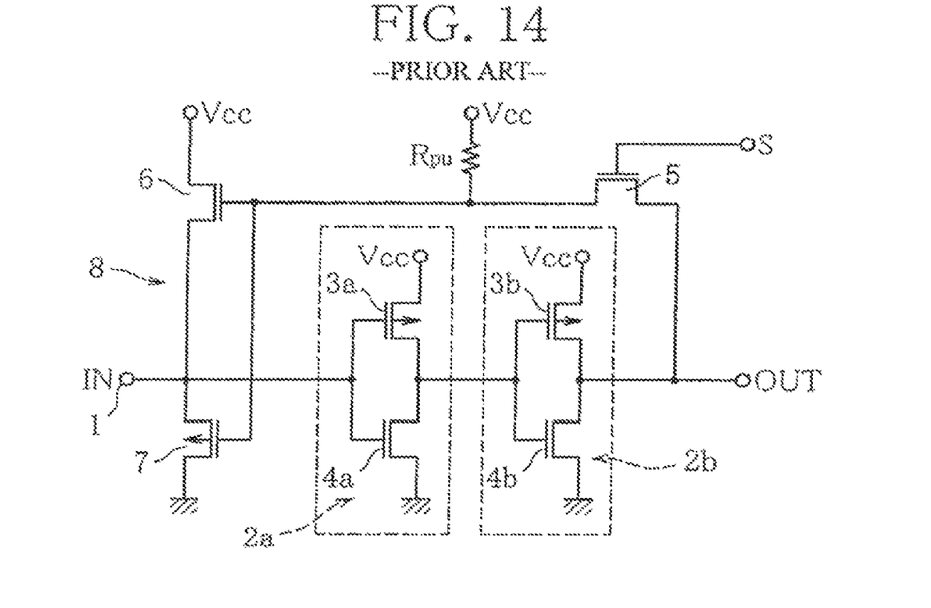
FIG. 14 is a view showing an example of a configuration of a conventional interface circuit.

For instance, as illustrated in FIG. 14, the leakage current can be reduced by providing a latch circuit 8, which is formed of a NMOS transistor 6 and a PMOS transistor 7 which are gate-controlled by an NMOS transistor 5, to an input node of an input buffer made up of two-stage inverter circuits 2a and 2b (see Patent Document 1, for example). When a signal (potential) having the H or L level is given to the external input terminal 1, the latch circuit 8 carries out a latch operation according to an output level of the input buffer (two-stage inverter circuits 2a and 2b) that operates in response to this signal. By doing this, the latch circuit 8 forcibly fixes the external input terminal 1 at the H or L level. At the same time, if the external input terminal 1 is in the floating state (open state), the latch circuit 8 turns off the NMOS transistor 5 by using an external signal S, and brings the NMOS transistor 6 and the PMOS transistor 7 into a conductive state (hereinafter referred to as "on") and a nonconductive state (hereinafter referred to as "off"), respectively, by using the pull-up resistor Rpu. In so doing, the latch circuit 8 maintains the external input terminal 1 at the H level.

As a similar technology, a bus-hold circuit is known, which is provided for the purpose of preventing abnormal phenomena including the leakage current and oscillation of a semiconductor device and a data error which occur when the external input terminal becomes open (see Patent Document 2 and Non-patent Document 1, for example). When the external input terminal comes into the floating state, the bus-hold circuit maintains the preceding logic level given to the external input terminal. A bus-hold circuit of this type is occasionally used as a substitute for a pull-up resistor or a pull-down resistor in order to prevent the bus from coming into an undefined state.

A bus-hold circuit of this type is installed with an overvoltage protection circuit for blocking the current that flows from an external input terminal when the external input terminal of the bus-hold circuit is provided with a signal at a potential higher than the operating voltage of the bus-hold circuit (see Patent Document 3, for example).

As a general-purpose logic IC in which the above bus-hold circuit is realized, the 74VCX series and the like are available in the market.

Patent Document 1: Unexamined Japanese Patent Publication No. 9-161486.
Patent Document 2: U.S. Pat. No. 5,432,462.
Patent Document 3: U.S. Pat. No. 6,150,845.
Non-patent Document 1: "AN-5006J Designing with Bushold"; Fairchild Semiconductor Corporation; Application note; First edited March 1999 (revised September 1999); page 1-3.

DISCLOSURE OF THE INVENTION

Problem to be Solved by the Invention

If a latch circuit 8 as shown in Patent Document 1 is installed in an interface circuit, it is required to ON-OFF control an NMOS transistor 5 by using an external signal S depending upon whether an external input terminal 1 is in a floating state (open state). Therefore, the interface circuit needs a special-purpose circuit that determines whether the external input terminal 1 is in the floating state (open state) and a special-purpose circuit for producing the external signal S to control operation of the latch circuit 8.

There is the problem of a leakage current in a bushold circuit applied to a multi-drop bus as described in Non-patent Document 1. If a logic level of the external input terminal is varied, the bus-hold circuit has the problem that electric current consumption is high.

As to a bus-hold circuit installed to prevent a bus from coming into an undefined state, there is concern that input is brought into the undefined state at the rising edge of power supply to the bus-hold circuit. For this reason, in order to stabilize a potential of the bus at the rising edge of power supply, it is necessary to provide, for example, a pull-up resistor or the like in addition to the bus-hold circuit.

The present invention has been made in light of the circumstances. It is an object of the invention to provide an interface circuit that is capable of automatically stabilizing an external input terminal at a predetermined H or L level without using an external signal when the external input terminal is in a floating state (open state), has noise resistance, and is formed in a simple structure in which there is no leakage current from the external input terminal.

Means for Solving Problem

In order to achieve the above object, the interface circuit according to the invention includes a high-voltage terminal and a low-voltage terminal forming a pair of power source terminals and an external input terminal, and stabilizes a logic level of the external input terminal at an H level potential (logic high signal) or an L level potential (logic low signal). The interface circuit is characterized by comprising a first inverter circuit that is configured with a transistor to invert a logic level of an input signal given to the external input terminal and output a logic level that is obtained by inverting the logic level of the input signal; a second inverter circuit that is configured with a transistor to generate an output signal having a potential in which the logic level outputted from the first inverter circuit is inverted, the potential being higher or lower than a potential of the input signal applied to the first inverter circuit through the external input terminal; and a feedback path through which the output signal of the second inverter circuit is positive-feedbacked to the external input terminal.

In other words, the interface circuit according to the invention basically has the first inverter circuit that inverts the logic level having the H level potential (logic high signal) or the L level potential (logic low signal) which is applied to the external input terminal, and the second inverter circuit that inverts the logic level of the output signal of the first inverter circuit, and is so configured as to positive-feedback the logic level of the output signal of the second inverter circuit to an input node (external input terminal) of the first inverter circuit.

Especially, a potential of the input signal applied to the input node of the first inverter circuit and a potential of the output signal outputted from an output node of the second inverter circuit are previously set so as to satisfy a relationship:

[the potential of the input signal]<[the potential of the output signal]

or

[the potential of the input signal]>[the potential of the output signal], and by positive-feedbacking the output signal of the output node of the second inverter circuit to the first input node (external input terminal), when the external input terminal is in a floating state, the logic level of the external input terminal is automatically maintained at the H level potential (logic high signal) or at the L level potential (logic low signal) due to a positive-feedback mechanism. It is sufficient if only the potential of the input signal and that of the output signal are slightly dissimilar in magnitude.

In the interface circuit thus constructed, when the external input terminal is in the floating state, an output signal having a potential higher or lower than a potential applied to the input node of the first inverter circuit by the amount corresponding to a predetermined potential is positive-feedbacked from the output node of the second inverter circuit to the input node of the first inverter circuit. As a result, the potential of the output signal of the second inverter circuit is gradually shifted toward the H or L level potential due to the positive-feedback mechanism, and is stabilized when reaching the H or L level potential.

Consequently, in the interface circuit according to the invention, even if the external input terminal is in the floating state (open state), the potential of the external input terminal is automatically stabilized at the H or L level potential. In the interface circuit according to the invention, in any of the cases where the potential of the external input terminal is automatically stabilized at the H or L level, the potential of the external input terminal is electrically fixed at the H level potential and the potential of the external input terminal is electrically fixed at the L level potential, the external input terminal is detached away from a high-voltage terminal and a low-voltage terminal by the first and second inverter circuits, so that a leakage current does not occur as in the case where a pull-up or pull-down resistor is used.

In the case where the potential of the external input terminal is automatically set at the H level potential, the second inverter circuit preferably includes:

(a) a first transistor that is connected to between the high-voltage terminal and the external input terminal, is in an OFF-state when an output signal of the first inverter circuit is at the H level potential, and is an ON-state (conductive state) when the output signal of the first inverter circuit is at the L level potential; and (b) second and third transistors serially interposed between the low-voltage terminal and the external input terminal, wherein at least either one of the second and third transistors is in an OFF-state (non-conductive state) when the output signal of the first inverter circuit is at the L level potential, and at least either one of the second and third transistors is in the OFF-state when the output signal of the first inverter circuit is at the H level potential, wherein when a potential of the input signal applied to the external input terminal is the H level potential, the second and third transistors output an output signal having a potential equal to or higher than the potential of the input signal, and when the input signal is at a potential other than the H level potential, the second and third transistors output an output signal having a potential higher than the potential of the input signal.

Either one of the second and third transistors may be in the OFF-state when the output signal of the first inverter circuit is at the L level potential, and the other of the second and third transistors may be in the OFF-state when the output signal of the first inverter circuit is at the H level potential. Alternatively, either one or both of the second and third transistors may be in the OFF-state regardless of whether the output signal of the first inverter signal is at the H or L level potential. The second and third transistors have a voltage shift function that raises the potential of the output signal of the second inverter circuit so that the potential of the output signal of the second inverter circuit becomes higher than the potential of the external input terminal, which is in the floating state, by the amount of a predetermined potential.

If the second inverter circuit is thus constructed, the first inverter circuit preferably has voltage shift means for reducing a potential of the output signal of the first inverter circuit with respect to the input signal having the L level potential which is applied through the external input terminal so that the potential of the output signal of the first inverter circuit becomes lower than the H level potential to such an extent that the first transistor in the second inverter circuit is not turned on. Because of the voltage shift means, the first inverter circuit is capable of increasing a convergence rate toward the H level potential in the positive-feedback mechanism.

In the case where the potential of the external input terminal is automatically set at the L level potential, the second inverter circuit may preferably includes:

(c) a first transistor that is connected to between the low-voltage terminal and the external input terminal, is in an OFF-state when a potential of an output signal of the first inverter circuit is the L level potential, and is in an ON-state when the potential of the output signal of the first inverter circuit is the H level potential; and (d) second and third transistors serially interposed between the high-voltage terminal and the external input terminal, wherein at least either one of the second and third transistors is in an OFF-state when the potential of the output signal of the first inverter circuit is the L level potential, and at least either one of the second and third transistors is in the OFF state when the potential of the output signal of the first inverter circuit is the H level potential, wherein when a potential of the input signal applied to the external input terminal is the L level potential, the second and third transistors output an output signal having a potential equal to or lower than the potential of the input signal, and when the input signal is at a potential other than the L level potential, the second and third transistors output an output signal having a potential lower than the potential of the input signal.

Either one of the second and third transistors may be in the OFF-state when the output signal of the first inverter circuit is at the H level potential, and the other of the second and third transistors may be in the OFF-state when the output signal of the first inverter circuit is at the L level potential. Alternatively, either one or both of the second and third transistors may be in the OFF-state regardless of whether the output signal of the first inverter circuit is at the H or L level potential. The second and third transistors have a voltage shift function for reducing the potential of the output signal of the second inverter circuit so that the potential of the output signal of the second inverter circuit becomes lower than the potential of the external input terminal, which is in the floating state, by the amount of a predetermined potential.

Specifically, if the second inverter circuit is thus constructed, the first inverter circuit preferably has voltage shift means for raising a potential of the output signal of the first inverter circuit with respect to the input signal having the L level potential which is applied through the external input terminal so that the potential of the output signal of the first inverter circuit becomes higher than the L level potential to such an extent that the first transistor in the second inverter circuit is not turned on.

Preferably, in the interface circuit thus constructed, the second inverter circuit is constructed so that the potential of the external input terminal is automatically set at the H level potential, and the output node of the second inverter circuit is provided with current supply means for supplying a fixed current in a direction from the high-voltage terminal toward the external input terminal. Alternatively, in the case where the second inverter circuit is constructed to automatically set the potential of the external input terminal at the L level potential, it is preferable that the output node of the second inverter circuit is provided with current supply means for supplying a fixed current in a direction from the external input terminal toward the low-voltage terminal.

The current supply means has an effect that reduces time for the turn-off operation of a MOS transistor and increases the convergence rate toward the H or L level potential in the positive-feedback mechanism despite a current leakage from the external input terminal when the potential of the external input terminal is fixed at the L or H level potential.

Regarding the current supplied to the output node of the second inverter circuit, when the external input terminal comes into the floating state, there simply generates a voltage drop in the MOS transistor that carries out the voltage shift function of the second inverter circuit, so that a leakage current can be suppressed to be further smaller than a leakage current that occurs when the pull-up or pull-down resistor is used.

Preferably, in the interface circuit, there is provided, for example, a resistor as a current limiting element that is serially interposed in the feedback path and limits the current flowing through the feedback path.

The interface circuit limits the current that flows into the external input terminal through the feedback path by using the current limiting element (for example, resistor) interposed in the feedback path. Therefore, in the interface circuit, the potential of the external input terminal which is stable at the H level potential can be shifted to the L level potential with a low drive current.

The interface circuit is an interface circuit that is connectable to a power source. The interface circuit comprises an external input terminal, a first inverter into which a potential of the external input terminal is inputted, a second inverter into which a potential of an output of the first inverter is inputted, and a feedback path through which a potential of an output of the second inverter is feedbacked to an input of the first inverter. The interface circuit is constructed so that if the feedback path is not provided, the potential of the output of the second inverter is always virtually higher than the potential of the external input terminal within a range where the potential of the external input terminal is virtually lower than a potential of a high potential power line.

Preferably the interface circuit is an interface circuit that is connectable to a power source, which comprises an external input terminal, a first inverter into which a potential of the external input terminal is inputted, a second inverter into which a potential of an output of the first inverter is inputted, and a feedback path through which a potential of an output of the second inverter is feedbacked to an input of the first inverter. Preferably, the interface circuit is constructed so that if the feedback path is not provided, the potential of the output of the second inverter is always virtually lower than the potential of the external input terminal within a range where the potential of the external input terminal is virtually higher than a potential of a low potential power line.

Strictly speaking, the external input terminal of the interface circuit according to the invention has a function as a so-called output terminal, which outputs a predetermined signal having the H or L level in the floating state. However, the term "external input terminal" will be consistently used here for convenience.

Effect of the Invention

According to the invention, it is possible to set the potential of the external input terminal, which is in the floating state, at the H or L level potential, to satisfactorily suppress the leakage current of the external input terminal, and to enhance noise resistance by keeping impedance low with respect to a power source voltage terminal or ground terminal of the external input terminal. Therefore, the interface circuit of the invention has a great advantage as an interface circuit for an external input terminal in various kinds of electronic devices, a semiconductor integrated circuit and the like. Furthermore, since the circuit itself is simple, the interface circuit of the invention has a merit of being easily installed into a semiconductor integrated circuit.

BEST MODE OF CARRYING OUT THE INVENTION

An interface circuit according to embodiments of the invention will be described below with reference to the attached drawings.

A high-voltage terminal and a low-voltage terminal which form a pair of power source terminals are described as a power source node that supplies a positive (plus) power source voltage Vcc and a ground node in which a potential is zero, respectively. However, the circuit may be so designed that the high-voltage terminal is grounded, and the low-voltage terminal supplies a negative (minus) potential. Alternatively, the circuit may be so designed as to supply a positive (Plus) power source voltage to the high-voltage terminal and a negative (minus) potential to the low-voltage terminal In other words, a potential $V_1$ supplied to the high-voltage terminal and a potential $V_2$ supplied to the low-voltage terminal satisfy a relationship, $V_1 > V_2$.

In this specification, a conductive state and a nonconductive state of a transistor are referred to as "ON-state" and "OFF-state", respectively.

Embodiment 1

Figure 1:
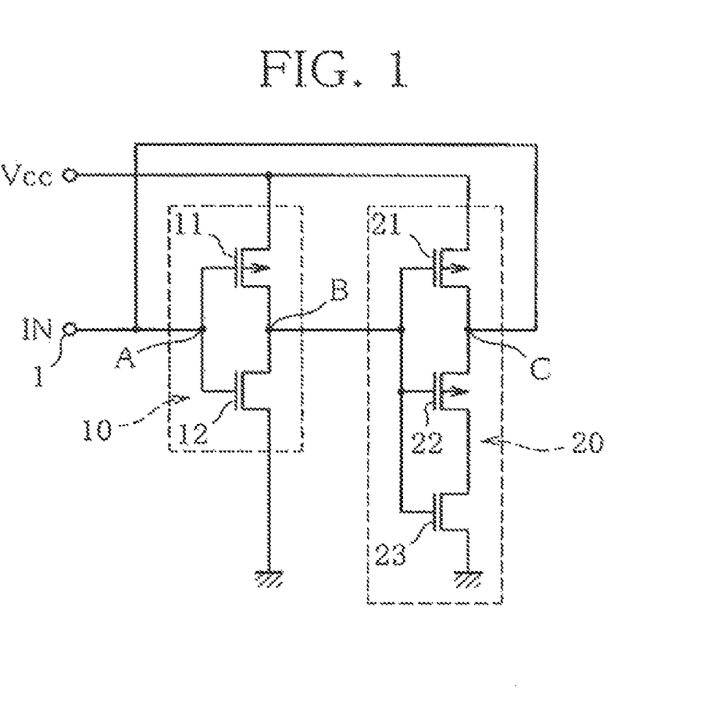
FIG. 1 is a configuration view of an interface circuit according to Embodiment I of the invention.

FIG. 1 shows a configuration of an interface circuit according to a first embodiment. Illustrated in this drawing is a configuration example in which a MOS transistor is used as a transistor. To be specific, 10 represents a first inverter circuit formed of a PMOS transistor 11 and an NMOS transistor 12, and 20 represents a second inverter circuit formed of two PMOS transistors 21 and 22 and an NMOS transistor 23.

In the first inverter circuit 10, drain electrodes of the PMOS transistor 11 and the NMOS transistor 12 are connected to each other. The first inverter circuit 10 is serially connected to between a power source node (high-voltage terminal) and a ground node (low-voltage terminal). Gate electrodes of the first inverter circuit 10 are connected in common to an external input terminal 1 through an input node A. The drain electrodes connected to each other are formed as an output node B. When receiving a signal having a predetermined potential at the external input terminal 1, the first inverter circuit 10 turns on and off the PMOS transistor 11 and the NMOS transistor 12 in a complementary manner. In so doing, the first inverter circuit 10 outputs to the output node B an output signal having a potential in which a logic level of the external input terminal (input node A) is inverted.

To be concrete, when an input signal applied from the external input terminal 1 to the input node A is at an H level potential, the first inverter circuit 10 makes the potential of the output node B equal to an L level potential by turning off the PMOS transistor 11 and turning on the NMOS transistor 12. In contrast, when the potential of the signal applied from the external input terminal 1 to the input node A is the L level potential, the PMOS transistor 11 is turned on, and the NMOS transistor 12 is turned off, thereby making the potential of the output node B equal to the H level potential.

In the second inverter circuit 20, two PMOS transistors 21 and 22 which are serially connected to each other and an NMOS transistor 23 are connected to between a power source node and a ground node. In the second inverter circuit 20, gate electrodes of the transistors 21, 22 and 23 are connected in common to form an input node, and connected to the output node B of the first inverter circuit 10. In the second inverter circuit 20, a contact point of a drain electrode of the PMOS transistor 21 and a source electrode of the PMOS transistor 22 functions as an output node C. The output node C is connected to the input node A of the first inverter circuit 10 to form a feedback path. Outputs of the inverter circuit 20 are positive-feedbacked to the first inverter circuit 10.

Basically, in response to the output signal of the first inverter circuit 10 at the input node (gate electrode), the PMOS transistors 21 and 22 and the NMOS transistor 23 forming the second inverter circuit 20 are turned on and off in a complementary manner, and have a level inverting function to provide to the output node C an output signal having a potential in which a logic level of the output node B of the first inverter circuit 10 is inverted. Especially, the PMOS transistor 22 and the NMOS transistor 23 have a voltage shift function that raises the potential of the node C by applying the output node C with a signal having a predetermined potential which is produced in between the source and drain electrodes when the PMOS transistor 22 and the NMOS transistor 23 are not in a fully ON-state.

More specifically, when the potential of the external input terminal 1 is the H level potential, and the first inverter circuit 10, in response to this potential, outputs the output signal having the L level potential, the PMOS transistors 21 and 22 are turned on, whereas the NMOS transistor 23 is turned off. Since the NMOS transistor 23 is off at this point, there is no leakage current that occurs through the NMOS transistor 23 in the external input terminal 1.

When the potential of the external input terminal 1 is the L level potential, and the first inverter circuit 10, in response to this potential, outputs the output signal having the H level potential, the PMOS transistors 21 and 22 are turned off, and the NMOS transistor 23 is turned on. Since the PMOS transistor 21 is off at this point, a leakage current that occurs through the PMOS transistor 21 does not occur in the external input terminal 1.

If the external input terminal 1 is brought from a grounded state (L level) into a floating state (open state), the potentials of the nodes A and C are not regulated by the external input terminal 1. As a result, the potential of node C is positive-feedbacked to the input node A of the first inverter circuit 10 and is increased by degree. The potential of the output of the first inverter circuit 10 is gradually decreased as the potential of the node C is increased. In this process, along with the drop of the potential of the input signal given to the input node of the second inverter circuit 20, the PMOS transistors 21 and 22 are turned on. At this time, the NMOS transistor 23 is turned off, and the potential of the output node C is forcibly fixed at the H level potential. Consequently, the potential of the external input terminal 1 is stabilized at the H level potential. In other words, if the external input terminal 1 is in the floating state (open state), the potential of the external input terminal 1 is automatically set at the H level potential.

Figure 2:
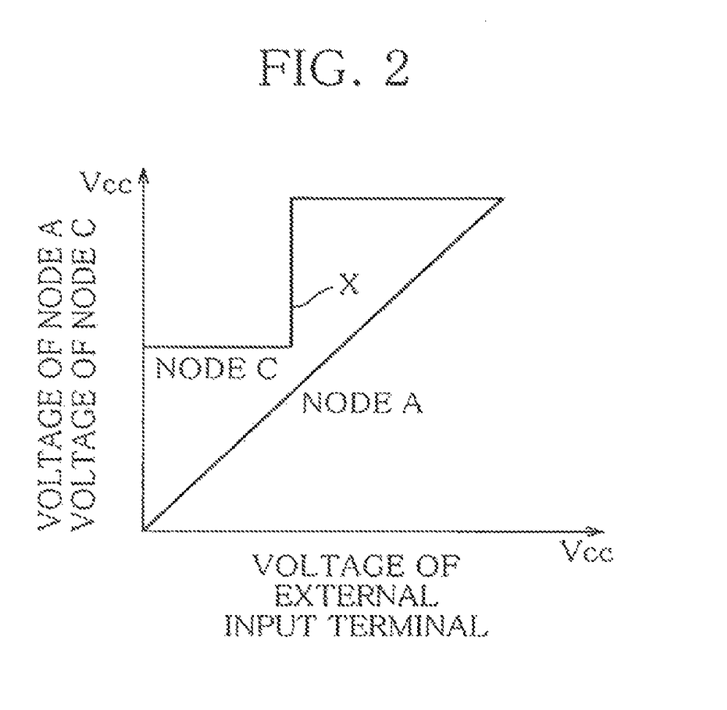
FIG. 2 is a view showing input/output characteristics when positive feedback from a second inverter circuit to a first inverter circuit in the interface circuit shown in FIG. 1 is stopped.

If the output of the second inverter circuit 20 is not positive-feedbacked to the input node A of the first inverter circuit 10, the second inverter circuit 20 per se outputs the output signal having a potential that is always higher than the potential applied to the node A with respect to the potential of the input signal applied to the external input terminal 1. More concretely, the second inverter circuit 20 outputs the output signal having a potential as illustrated by a characteristic X in FIG. 2. Stated differently, for example, when the external input terminal 1 is grounded, and the potential applied to the node A is not fixed at the L level potential, the potential of the node A is gradually increased by a signal having a potential higher than the potential of the external input terminal 1 which is positive-feedbacked from the second inverter circuit 20 when the potential of the output signal of the second inverter circuit 20 is positive-feedbacked to the input node A of the first inverter circuit 10. As a result, the potential of the node A automatically converges to and is stabilized at the H level potential. The potential of the node A is automatically set at the H level potential when the external input terminal 1 is in the floating state (open state).

According to the interface circuit thus constructed, when the potential of the external input terminal 1 is set at the H or L level potential, the input state of the external input terminal 1 can be maintained stable without generating a leakage current. Especially when the external input terminal 1 is in the floating state (open state), the potential of the external input terminal 1 can be automatically set at the H level potential, which eliminates the need for a conventional pull-up resistor Rpu. Moreover, when the potential of the external input terminal 1 is forcibly fixed at the L level potential, the PMOS transistor 21 is in the OFF-state as mentioned above, so that a leakage current through the external input terminal 1 does not occur. Accordingly, the interface circuit of the invention is capable of stabilizing the potential of the external input terminal 1 at the H or L level potential when various kinds of electronic devices are connected to the external input terminal 1.

Embodiment 2

Figure 3:
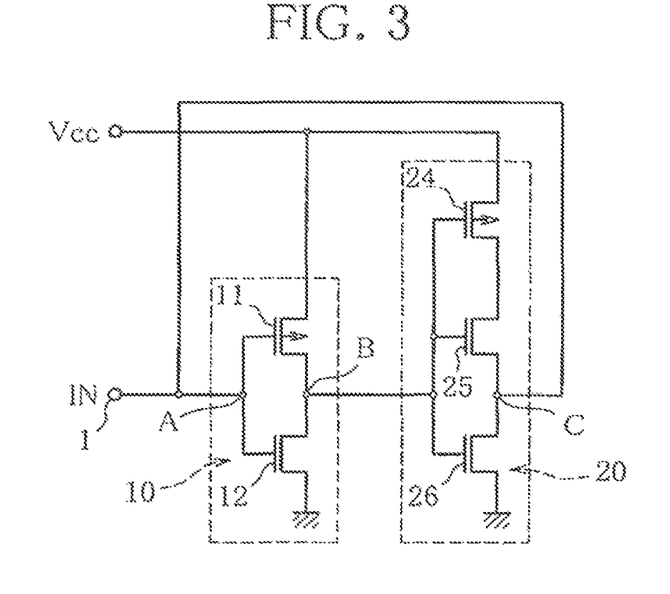
FIG. 3 is a configuration view of an interface circuit according to Embodiment 2 of the invention.

The above-mentioned embodiment is so designed that when the external input terminal 1 is in the floating state (open state), the potential of the external input terminal 1 is automatically set at the H level potential. However, the interface circuit according to the invention may be constructed so that the potential of the external input terminal 1 is automatically set at the L level potential. FIG. 3 is a configuration view of an interface circuit showing such an embodiment. Parts identical to those of the interface circuit shown in FIG. 1 are provided with the same reference numerals.

The interface circuit is configured by connecting the second inverter 20 to the output node B of the first inverter circuit 10. In the second inverter circuit 20, a PMOS transistor 24 and two NMOS transistors 25 and 26 are serially connected to between a power source node and a ground node, and gate electrodes of the transistors 24, and 26 are connected in common to form an input node that is connected to the output node B of the first inverter circuit 10. A contact point of a source electrode of the NMOS transistor 25 and a drain electrode of the NMOS transistor 26 is an output node C. The output node C is connected to the input node A of the first inverter circuit 10. In this manner, the output of the second inverter circuit 20 is positive-feedbacked to the first inverter circuit 10.

Basically, the PMOS transistor 24 and the NMOS transistors 25 and 26 forming the second inverter circuit 20 are turned on and off in a complementary manner in response to the output signal of the first inverter circuit 10 at the input node (gate electrode). The PMOS transistor 24 and the NMOS transistors 25 and 26 have a level inverting function that provides to the output node C a signal at a potential in which a logic level of the output node B of the first inverter circuit 10 is inverted. Especially the NMOS transistor 25 and the PMOS transistor 24 have a voltage shift function to reduce the potential of the node C by applying the output node C with a predetermined voltage drop caused in between the source and drain electrodes when the NMOS transistor 25 and the PMOS transistor 24 are not in a fully ON-state.

According to the interface circuit thus constructed, when the external input terminal 1 is in the floating state (open state), the potentials of the nodes A and C are not regulated by the external input terminal 1, so that the potential of the node C is positive-feedbacked to the input node A of the first inverter circuit 10 and is reduced by degree. Along with the drop of the potential, the potential of the output of the first inverter circuit 10 is gradually increased. The PMOS transistor 24 is turned off due to the rise of the potential of the signal given to the input node of the second inverter circuit 20. At this time, the NMOS transistors 25 and 26 are turned on, and the potential of the output node C is forcibly fixed at the L level. As a result, the potential of the external input terminal 1 is stabilized at the L level potential. In other words, if the external input terminal 1 is in the floating state (open state), the potential of the external input terminal 1 is automatically set at the L level potential.

The interface circuit thus constructed is capable of maintaining a stable state of the potential of the external input terminal 1 without causing a leakage current when the potential of the external input terminal 1 is set at the H or L level as in the interface circuit shown in FIG. 1. Especially in the above interface circuit, when the external input terminal 1 is in the floating state (open state), the potential of the external input terminal 1 can be automatically set at the L level potential. Therefore, it is not necessary in the interface circuit of the invention to connect a pull-down resistor Rpd to reduce the potential of the external input terminal 1 as in conventional art. Furthermore, when the potential of the external input terminal 1 is forcibly fixed at the H level potential, a leakage current through the external input terminal 1 does not occur since the NMOS transistor 26 is in the OFF-state. The interface circuit of the invention has a great advantage of stabilizing the potential of the external input terminal 1 at the H or L level potential when various kinds of electronic devices are connected to the external input terminal 1.

Embodiment 3

Figure 4:
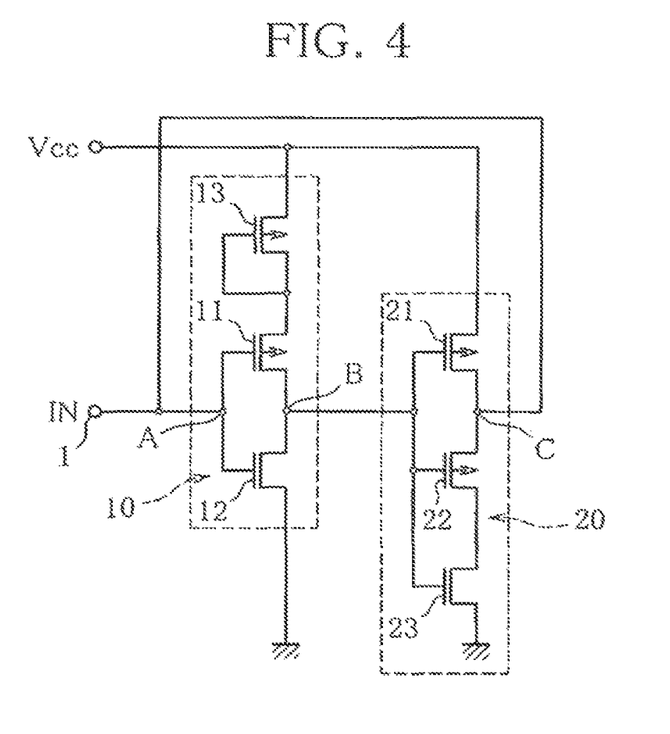
FIG. 4 is a configuration view of an interface circuit according to Embodiment 3 of the invention.

In the interface circuit according to the invention, it is also effective to incorporate into the first inverter circuit 10 a diode-connected MOS transistor that shifts the potential of the output signal outputted from the first inverter circuit 10 to such an extent that the second inverter circuit 20 is not turned on or off when the potential applied to the input node A is either the L or H level potential. Specifically, for instance, in the case of the interface circuit shown in FIG. 1, a diode connected PMOS transistor 13 is serially connected to between a power source node and a source electrode of a PMOS transistor 11 as illustrated in FIG. 4, thereby reducing a potential of an output node B by the amount of operation threshold voltage of the PMOS transistor 13.

In the interface circuit thus constructed, if the external input terminal 1 is grounded, the PMOS transistor 11 is turned on, and the NMOS transistor 12 is turned off. A potential of the source electrode of the PMOS transistor 11 and the potential of the node B then become approximately equal to each other. At this point, the potential of the node B is reduced to be lower than voltage Vcc of the power source node by the amount of the operation threshold voltage of the PMOS transistor 13 since source-drain resistance of the NMOS transistor 12 is larger than source-drain resistance of the PMOS transistor 13. In addition, potential difference between a gate and a source of the PMOS transistor 21 in the second inverter circuit 20 becomes approximately equal to potential difference between a gate and a source of the PMOS transistor 13 in the first inverter circuit 10. Therefore, the PMOS transistor 21 is turned off. As a result, the interface circuit can maintain the potential of the external input terminal 1 at the L level potential without causing a leakage current.

In practice, the interface circuit of the invention sometimes causes a small leakage current due to variation of the operation threshold voltage and of transistor size of the PMOS transistor 13 and the PMOS transistor 21. However, this does not diminish the advantage of the invention.

When the external input terminal 1 is released from the grounded state and brought into the floating state, the potential of the node A is increased due to a positive-feedback mechanism from the second inverter circuit 20. Along with the rise of the potential of the node A, a potential of an output signal of the first inverter circuit 10 is reduced, and the potential of the external input terminal 1 is automatically set at the H level potential as stated above.

When the PMOS transistor 11 is in a ON-state, the PMOS transistor 13 and the PMOS transistor 21 of the second inverter circuit 20 form an equivalent current mirror circuit. Due to the existence of the PMOS transistor 13 as described above, a potential applied to the gate electrode of the PMOS transistor 21 (potential of the node B) is maintained lower than the power source voltage Vcc of the PMOS transistor 21 by the amount of the operation threshold voltage of the PMOS transistor 21. Accordingly the external input terminal 1 comes into the floating state, and the potential of the external input terminal 1 is increased. Consequently, it is possible to shorten time until reducing a potential of a signal applied to the gate electrode of the PMOS transistor 21 below the operation threshold voltage of the PMOS transistor 21. As a result, the PMOS transistor 21 is instantaneously turned on, so that it is possible to drastically reduce the time required for the potential of the external input terminal 1 to be shifted from the floating state to the H level potential.

Figure 5:
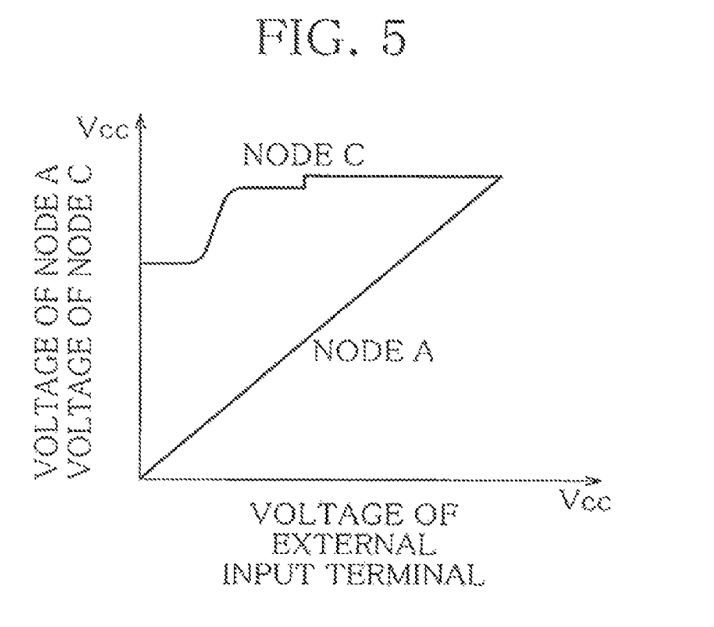
FIG. 5 is a view showing input/output characteristics when positive feedback from the second inverter circuit to the first inverter circuit in the interface circuit shown in FIG. 4 is stopped.

In this case, if the output of the second inverter circuit 20 is not positive-feedbacked to the input node A of the first inverter circuit 10, the potential of the output signal outputted from the second inverter circuit 20 (potential of the node C) changes, for example, as shown by a characteristic Y of FIG. 5 with respect to the potential of the signal applied to the external input terminal 1, thereby becoming a potential that is always larger than the potential applied to the node A. For this reason, when the potential of the signal applied to the node A is not fixed at the L or H level potential, if the output signal of the second inverter circuit 20 is positive-feedbacked to the input node A of the first inverter circuit 10, the potential of the output signal of the second inverter circuit 20 quickly becomes the H level potential.

Embodiment 4

Figure 6:
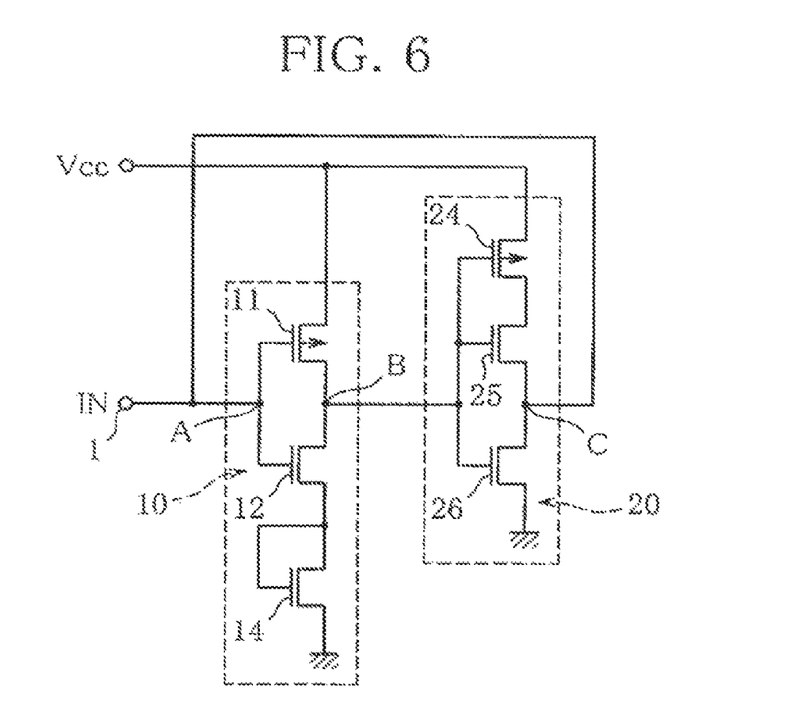
FIG. 6 is a configuration view of an interface circuit according to Embodiment 4 of the invention.

In the case of the interface circuit shown in FIG. 3, a diode-connected NMOS transistor 14 is connected to between the source electrode and the ground node of the NMOS transistor 12 as illustrated in FIG. 6, and a potential applied to the gate electrode of the NMOS transistor 26 in the second inverter circuit 20 (potential of the node B) is set higher than a ground potential of the NMOS transistor 26 by the amount of the operation threshold voltage of the NMOS transistor 26.

Since the interface circuit of the invention uses the above NMOS transistor 14, the potential of the external input terminal 1 is shifted from the H level potential to the floating state and is reduced. Accordingly, it is possible to shorten time until raising the potential applied to the gate electrode of the NMOS transistor 26 above the operation threshold voltage of the NMOS transistor 26. As a result, in the interface circuit of invention, since the NMOS transistor 26 is instantaneously turned on, it is possible to drastically reduce time required for the potential of the external input terminal 1 to be shifted from the floating state to the L level potential.

Embodiment 5

In the interface circuit of the invention, if the potential of the external input terminal 1 is set at the H or L level potential by using the interface circuit, it is also effective to supply a fixed current from an external power source to the external input terminal 1. That is to say, in the interface circuit illustrated in FIG. 1, when the external input terminal 1 comes into the floating state, the power source voltage Vcc is applied to the external input terminal 1 by the PMOS transistor 21 in the second inverter circuit 20, which increases the potential of the external input terminal 1. The PMOS transistor 21 has a sufficiently high resistance value during an OFF-state in order to prevent a leakage current caused when the external input terminal 1 is grounded. Therefore, when the external input terminal 1 is brought from the grounded state into the floating state, it sometimes takes long time before the potential of the external input terminal 1 is shifted to the H level potential as described above. The resistance value of the PMOS transistor 21 during an OFF-state is changed due to ambient temperature. Accordingly, the time that is required to turn on the PMOS transistor 21 and to shift the potential of the external input terminal 1 to the H level potential has a temperature dependency.

Figure 7:
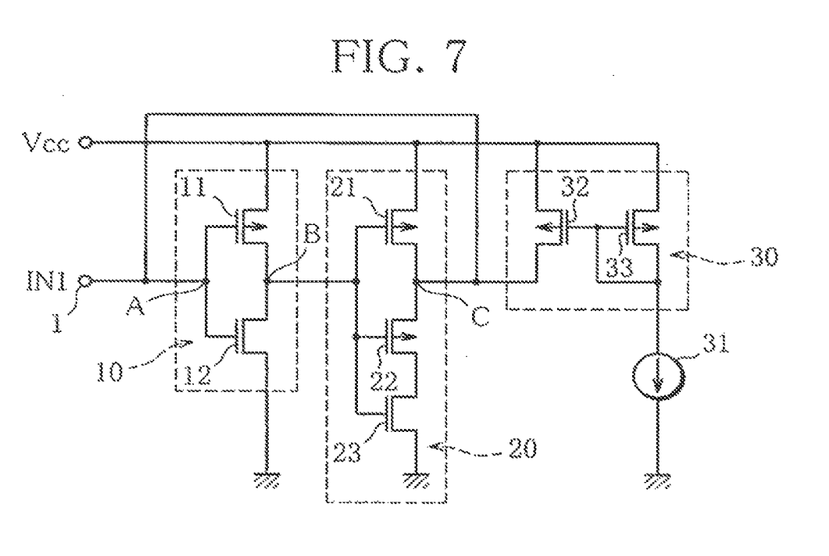
FIG. 7 is a configuration view of an interface circuit according to Embodiment 5 of the invention.

Therefore, the interface circuit of the invention may be provided with a current mirror circuit 30 as a power source for supplying the fixed current to the external input terminal 1 as illustrated in FIG. 7. In addition, it is preferable that the interface circuit of the invention reduces the time required to turn on the PMOS transistor 21. To be specific, in the interface circuit of the invention, the current mirror circuit 30 of a current-discharge type which is driven by a constant current source 31 is formed of two PMOS transistors 32 and 33. When the external input terminal 1 comes into the floating state, the constant current source 31 supplies the fixed current from the current mirror circuit 30 to the external input terminal 1.

In the interface circuit provided with the current mirror circuit 30 mentioned above, when the external input terminal 1 is grounded, current flows from the current mirror circuit 30 to the external input terminal 1. When the external input terminal 1 is brought into the floating state, the potential of the external input terminal 1 is rapidly increased due to the current supplied from the current mirror circuit 30 in the interface circuit of the invention. As a result, the interface circuit of the invention reduces the time required for the PMOS transistor 21 in the second inverter circuit 20 to be turned on.

Therefore, the potential of the external input terminal 1 is quickly raised to the H level potential. The PMOS transistor 21 is then turned on, and impedance of the external input terminal 1 with respect to the ground node is controlled by impedance of the NMOS transistor 23. Accordingly, most of the current that flows from the current mirror circuit 30 to the external input terminal 1 disappears.

Impedance of the external input terminal 1 with respect to the power source node is controlled by impedance of the PMOS transistor 21. For this reason, the current supplied from the current mirror circuit 30 to the external input terminal 1 can be reduced to be much smaller than the leakage current caused by the conventional pull-up Rpu. As compared to the interface circuit that is constructed as shown in FIG. 1, working current is slightly increased in the interface circuit shown in FIG. 7. It is possible, however, to instantaneously shift the potential of the external input terminal 1 in the floating state to the H level potential. Consequently, the interface circuit of the invention has an advantage of speeding up the operations in the interface circuit while reducing the leakage current.

Embodiment 6

The above-described current mirror circuit can also be adapted to an interface circuit that automatically sets the potential of the external input terminal 1 in the floating state at the L level potential. Although details are not illustrated in the drawings, the interface circuit shown FIG. 3 can be formed by constructing a current mirror circuit of a current-suction type so that a certain amount of current is sucked from the external input terminal 1. In the above-described interface circuit, time required for the NMOS transistor 26 to be turned on is reduced, so that the above-described interface circuit has a similar advantage to the interface circuit shown in FIG. 7.

Embodiment 7

In each of the above embodiment, the second inverter circuit 20 of the interface circuit of the invention is formed of the two PMOS transistors 21 and 22 and the NMOS transistor 23 as an example of automatically setting the potential of the external input terminal 1 in the floating state at the H level potential. Moreover, as an example of automatically setting the potential of the external input terminal 1 in the floating state at the L level potential, the second inverter circuit 20 of the interface circuit of the invention is formed of the PMOS transistor 24 and the two NMOS transistors 25 and 26.

However, a basic requirement for the second inverter circuit 20 is to include:

(a) a main MOS transistor (level inverting function) that inverts a logic level by being turned on or off according to the potential of the output signal outputted from the first inverter circuit 10; and (b) an auxiliary MOS transistor (voltage shift function) that produces the output signal having the predetermined potential when the external input terminal is in the floating state by being turned off according to the current flowing through the main MOS transistor or according to the potential of the output signal outputted from the first inverter circuit 10, and shifts the potential of the output signal from the main MOS transistor.

Specifically in the case of the interface circuit that sets the potential of the external input terminal 1 at the H level potential when the external input terminal 1 is in the floating state, the second inverter circuit 20 needs only include at least one main MOS transistor that is turned on or off according to the potential of the output signal from the first inverter circuit 10 and at least one auxiliary MOS transistor that raises the potential of the output node C so that the potential of the output node C is higher than the potential applied to the external input terminal 1.

In the case of the interface circuit that sets the potential of the external input terminal 1 at the L level potential when the external input terminal 1 is in the floating state, the second inverter circuit 20 needs only include at least one main MOS transistor that is turned on or off according to the potential of the output signal outputted from the first inverter circuit 10 and at least one auxiliary MOS transistor that reduces the potential of the output node C so that the potential of the output node C is lower than the potential of the signal applied to the external input terminal 1 when the external input terminal 1 is in the floating state.

Figure 8A:
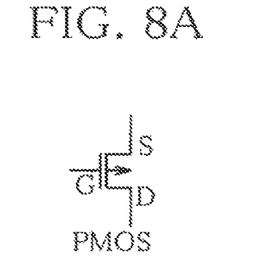
FIG. 8A is a view showing an example of use in which a PMOS transistor is utilized as a switch.
Figure 8B:
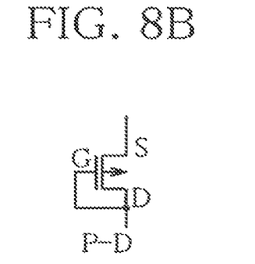
FIG. 8B is a view showing an example of use of a MOS transistor in which a gate and a drain of a PMOS transistor are connected to each other to form a p-channel diode.
Figure 8C:
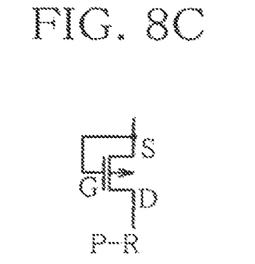
FIG. 8C is a view showing an example of use of a MOS transistor in which a gate and a source of a PMOS transistor are connected to each other to form a p-channel resistor.
Figure 8D:
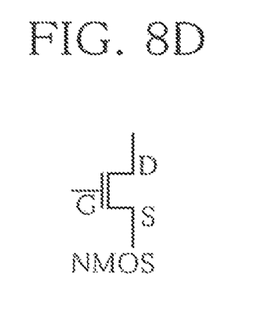
FIG. 8D is a view showing an example of use in which an NMOS transistor is utilized as a switch.
Figure 8E:
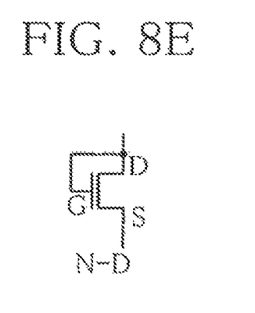
FIG. 8E is a view showing an example of use of a MOS transistor in which a gate and a drain of an NMOS transistor are connected to each other to form an n-channel diode.
Figure 8F:
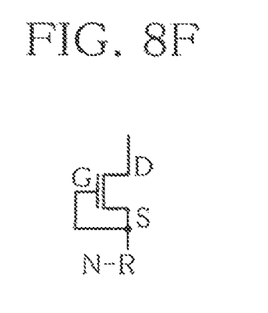
FIG. 8F is a view showing an example of use of a MOS transistor in which a gate and a source of an NMOS transistor are connected to each other to form an n-channel resistor.

The MOS transistors have functions of a switch, a diode and a resistor as illustrated in FIGS. 8A, 8B, 8C, 8D, 8E and 8F. More specifically, each of the PMOS and the NMOS having a three-terminal structure in which a gate is used as an input terminal as illustrated in FIGS. 8A and 8D serves as a switch that turns on/off between the source and drain according to the potential of the input terminal. The PMOS and the NMOS having a two-terminal structure in which a gate and a drain are connected to each other as illustrated in FIGS. 8B and 8E serve as a p-channel diode (P-D) and an n-channel diode (N-D), respectively. Furthermore, the PMOS and the NMOS having a two-terminal structure in which a gate and a source are connected to each other as illustrated in FIGS. 8C and 8F serve as a p-channel resistor (P-R) and an n-channel resistor (N-R), respectively.

A resistance value, an operation threshold voltage and the like of the PMOS and the NMOS having a three terminal structure in which a gate is used as an input terminal as illustrated in FIGS. 8A and 8D are determined by channel widths of these MOS transistors and the like. Accordingly, if it is desired that input/output characteristics of the first and second inverter circuits 10 and 20 in the interface circuit when the positive feedback is not performed be similar to those shown in FIG. 2 or 5, it is only necessary to select MOS transistors according to such a desire, allow at least one of the MOS transistors to be turned on/off, and provide at least one of the other MOS transistors with a level shift function that shifts the potential of the output signal.

However, it is also a fact that, the inverter circuits 10 and 20 may not function as inverter circuits depending upon the combination of the MOS transistors illustrated in FIG. 8.

Figure 9:
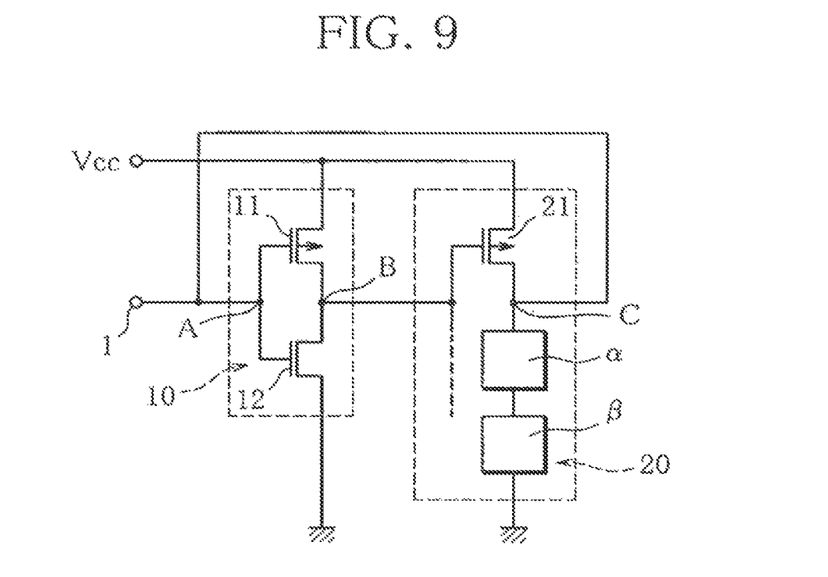
FIG. 9 is a view showing an example of a configuration of an interface circuit, which is used when a configuration example of the second inverter circuit is verified.

The inventors verified what functions were required in MOS transistors to be employed as second-stage and third stage MOS transistors if a first-stage MOS transistor located on the side of the power source node in the second inverter circuit 20 was the PMOS transistor 21 as shown in FIG. 9 and functioned as a main MOS transistor (first transistor) that is turned on or off according to the potential of the output signal outputted from the first inverter circuit 10. This verification was conducted under the conditions that the transistors forming the first inverter circuit 10 and the first-stage to third-stage MOS transistors of the second inverter circuit 20 were all equal in size, and that the external input terminal 1 in floating state was at the H level potential.

Figure 10:
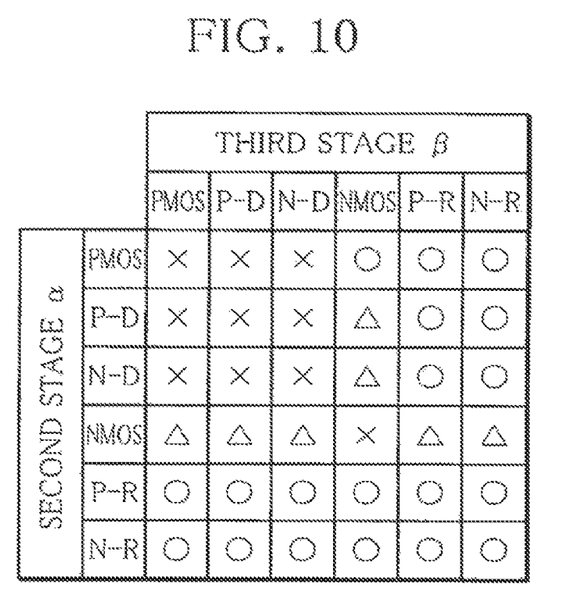
FIG. 10 is a view showing a result of verification of the second inverter circuit shown in FIG. 9.

FIG. 10 shows a result of the verification. In FIG. 10, "O" means that the circuit effectively functions as the second inverter circuit 20. "X" means that the circuit does not function as the second inverter circuit 20. "Δ" means that the circuit does not function as the second inverter circuit 20 when the first-stage to third-stage MOS transistors are all equal in size, but can be made to function as the second inverter circuit 20 by adjusting the sizes of the first-stage to third-stage MOS transistors.

That is to say, the verification result shown in FIG. 10 indicates that when the first-stage MOS transistor is formed of a PMOS transistor that carries out the ON-OFF operation, it is possible to design as the second inverter 20 if at least either one of the second-stage and third-stage MOS transistors is a P resistor, an N resistor or a three-terminal NMOS transistor, and if at least either one of the second-stage and third-stage MOS transistors is selected from transistors other than the three-terminal NMOS transistor.

Figure 11:
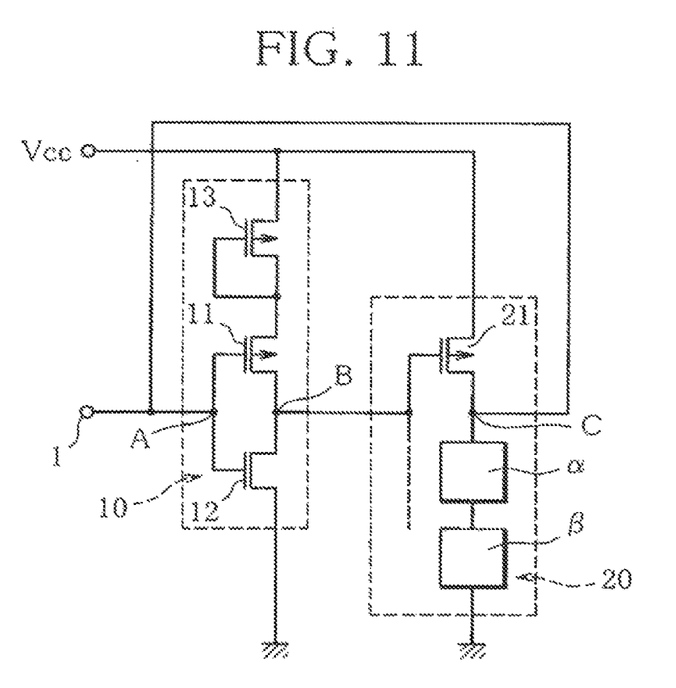
FIG. 11 is a view showing another configuration example of the interface circuit, which is used when a configuration example of the second inverter circuit is verified.

The inventors also conducted a verification in the same manner as to the configuration of the second inverter circuit 20 in the case where the first inverter circuit 10 itself was provided with the PMOS transistor 13 that shifts the potential of the output signal as illustrated in FIG. 11. Consequently, a verification result shown in FIG. 12 was obtained. The verification was conducted under the conditions that the transistors forming the first inverter circuit 10 and the first-stage to third-stage MOS transistors of the second inverter circuit 20 were all identical in characteristics, and that the external input terminal 1 in the floating state was at the H level potential.

These verifications brought the following result.

(a) By providing a first transistor 21 that is connected to between the power source node (high-voltage terminal) and the external input terminal 1, the first transistor 21 being turned off when the potential of the output signal of the first inverter circuit 10 is the H level potential, and turned on when the potential of the output signal of the first inverter circuit 10 is the L level potential, and second and third transistors 22 and 23 that are serially interposed between the ground node (low-voltage terminal) and the external input terminal 1; and (b) by constructing the second inverter circuit 20 by the second and third transistors 22 and 23 whose operating conditions are set such that at least either one of the second and third transistors 22 and 23 is turned off when the potential of the output signal of the first inverter circuit 10 is the L level potential, and at least either one of them is turned off when the potential of the output signal of the first inverter 10 is the H level potential, (c) a potential equal to or higher than the potential of the input signal applied to the external input terminal 1 is outputted when the potential of the input signal is the H level potential, and an output signal having a potential higher than the potential of the input signal is outputted when the potential of the input signal is at a potential other than the H level potential.

Figure 12:
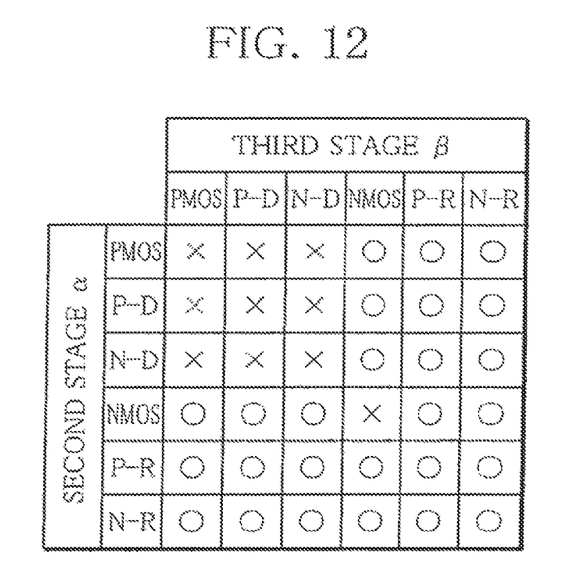
FIG. 12 is a view showing a result of verification of the second inverter circuit shown in FIG. 11.

Verification results shown in FIGS. 10 and 12 relate to the case in which the interface circuits shown in FIGS. 9 and 11 are constructed to raise the potential of the external input terminal 1 in the floating state to the H level potential.

Accordingly, criteria for selecting the second-stage and third-stage MOS transistors of the interface circuit that maintains the external input terminal 1 at the L level potential are as listed below.

(a) Polarities of the ground node and the power source node are reversed.

(b) A transistor to be located on the side of the ground node in the second inverter circuit 20 is the first-stage MOS transistor.

(c) Polarities of all MOS transistor channels are reversed.

Embodiment 8

In the interface circuit of the invention, when a signal having the H level potential is inputted to the external input terminal 1 or when the external input terminal 1 is in the floating state and is stable at the H level potential, the potential of the external input terminal 1 sometimes cannot be shifted from the H level potential to the L level potential in a circuit with a low current drive capability. This is because the PMOS transistor 21 with low on resistance is used in the second inverter circuit 20. In other words, when the external input terminal 1 is at the H level potential, the PMOS transistor 21 forming the second inverter circuit 20 is in an ON-state. At this point, the PMOS transistor 21 provides the power source voltage Vcc for driving the PMOS transistor 21 to the external input terminal 1 through the low on resistance of the PMOS transistor 21. For this reason, an element connected to the external input terminal 1 is required to have the current drive capability that shifts the potential of the external input terminal 1 from the H level potential to the L level potential, prevailing against the current flowing from the node C into the external input terminal 1.

Figure 15:
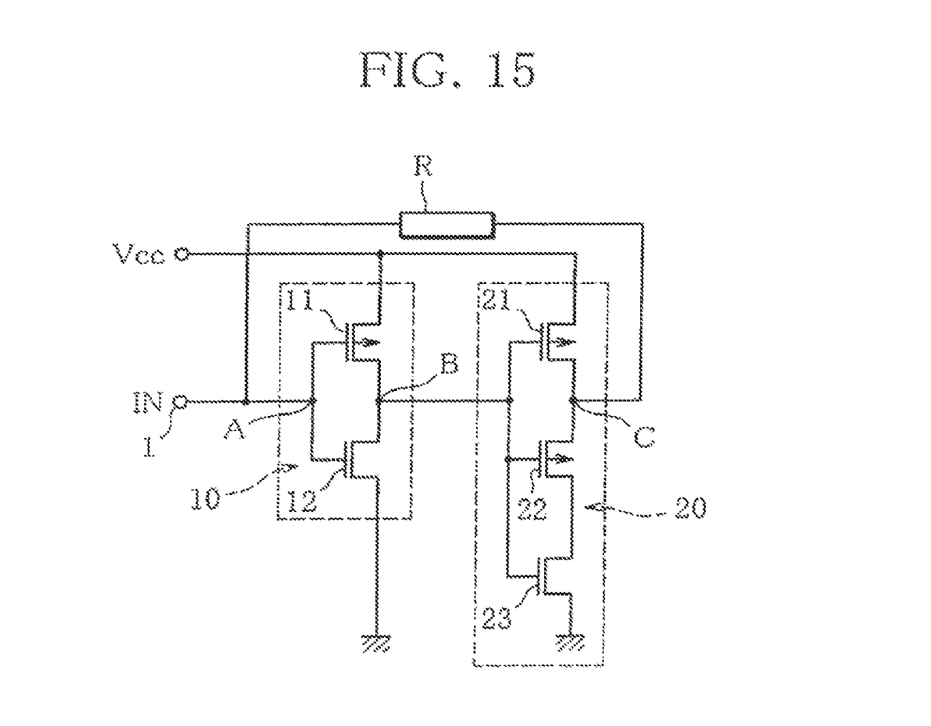
FIG. 15 is a configuration view of an interface circuit according to Embodiment 8 of the invention.

Therefore, in the interface circuit of the invention, it is preferable that a current limiting element R is serially interposed in the feedback path running between the node C and the node A as illustrated in FIG. 15. FIG. 15 is a configuration view of an interface circuit according to Embodiment 8, and parts identical to those of the interface circuit shown in FIG. 1 are provided with the same reference numerals.

The current limiting element R limits the current flowing from the node C into the external input terminal 1 when the potential of the external input terminal 1 is shifted from the H level potential to the L level potential. Concretely, the current limiting element R may be a resistor, the p-channel resistor (P-R) shown in FIG. 8C or the n-channel resistor (N-R) shown in FIG. 8F.

According to the interface circuit in which the current limiting element R is serially interposed in the feedback path, when an element for driving the external input terminal 1 shifts the potential of the external input terminal 1 from the H level potential to the L level potential, the current limiting element R not only limits the current flowing from the power source but also acts as a general pull-up resistor. Therefore, in the interface circuit of the invention, even if the element having a low current drive capability drives the external input terminal 1, it is possible to shift the potential of the external input terminal 1 from the H level potential to the L level potential without fail.

In the interface circuit of the invention, although the current limiting element R is serially interposed in the feedback path, an external signal is unnecessary as in the other embodiments, and the potential of the external input terminal 1 can be automatically set at the H or L level potential while the advantage of preventing a leakage current is retained.

If the interface circuit of the invention is applied especially to a bus-hold circuit that is applied to a multidrop bus, the problem of the leakage current is solved, and only a small amount of consumption current is required even if the logic level of the external input terminal is changed. In the interface circuit of the invention, since the potential of the external input terminal 1 is automatically set at the H or L level potential, the problem that the external input terminal 1 comes into the undefined state at the rising edge can be solved, too. The interface circuit of the invention does not require a pull-up resistor and a pull-down resistor, so that it is possible to reduce chip area of a semiconductor device.

A general bus-hold circuit is installed with an over voltage protection circuit that prevents the current flowing from an external input terminal of the bus-hold circuit when a signal having a potential higher than differential voltage is given to the external input terminal. Needless to say, the interface circuit of the invention may be provided with measures against an over voltage input as in a bus-hold circuit described in Patent Document 3 and the like.

The current limiting element R of Embodiment 8 shown in FIG. 15 has the advantage of limiting the current flowing from the external input terminal 1 to the node C. The interface circuit of the invention is very effective for the reasons that the current flowing from the external input terminal 1 to the node C can be effectively prevented by using an anisotropic resistive element as the current limiting element R, and the like.

Embodiments 1 to 8 show the configuration examples in which the transistors used in the interface circuit of the invention are all MOS transistors. If the interface circuit of the invention is incorporated into an integrated circuit (LSI) using only MOS transistors as transistors in the circuit, it is possible to have the advantage of being able to avoid complicating a fabrication process of forming the transistors on a substrate as long as all the transistors in the interface circuit of the invention are also MOS transistors. However, it is also possible to use MES transistors instead of the MOS transistors in the interface circuit of the invention. In addition, any transistors for the use in an LSI are applicable to the embodiments of the invention.

As described above, according to the interface circuit of the invention, when the external input terminal 1 is in the floating state, the potential of the external input terminal 1 can be set at the H or L level potential. The interface circuit according to the invention does not require a pull-up resistor Rpu and a pull-down resistor Rpd which are required in conventional art. The interface circuit according to the invention is capable of setting the potential of the external input terminal 1 at the H or L level potential (it is previously determined whether the potential of the external input terminal 1 is to be set at the H or L level potential) without providing a control signal on the basis of a determination as to whether the external input terminal 1 is in the floating state as in the circuit shown in FIG. 14.

The interface circuit according to the invention is capable of effectively preventing a leakage current by the highly resistive MOS transistor when the potential of the external input terminal 1 is set at the H or L level potential. Therefore, the interface circuit according to the invention offers great practical advantages as an interface circuit for an external input terminal in various kinds of electrical devices, semiconductor integrated circuits and the like in comparison with the cases where the potential of the external input terminal 1 is determined by using the pull-up resistor Rpu and the pull-down resistor Rpd. Moreover, because of the simple circuit configuration, the interface circuit according to the invention can be applied to a semiconductor integrated circuit, such as a CPU and a memory, without difficulty. If the interface circuit of the invention is formed into an independent package, and this package is connected to an external input terminal/control terminal of an existing digital circuit, a logic level of the external input terminal/control terminal can be set at either H or L level.

The invention is not limited to the above-described embodiments. In each of the embodiments, the second inverter circuit 20 is realized using the three MOS transistors. However, the invention may be realized by using two or more than three MOS transistors. Or, for instance, the second-stage and third-stage MOS transistors formed into the two-terminal structure by connecting the gate and the source to each other may be replaced with one MOS transistor having a two terminal structure in which a gate and a source with sufficiently high resistance values are connected to each other. Alternatively, the interface circuit of the invention may be devised so that switching operation speed is increased by making the first-stage MOS transistor with a plurality of MOS transistors connected in parallel. Furthermore, it is sufficient if a designer or the like designs the inverter circuit so as to implement the afore-mentioned operation characteristics while properly employing various circuit configurations for realizing the inverter circuit. Various modifications can be made without deviating from the spirit and scope of the invention.

What is claimed is:

1. A method for stabilizing a logic level of a node at an H or L level potential, the method comprising:
    inverting the logic level of an input signal given to the node;
    generating an output signal having a potential in which the inverted logic level of the input signal is inverted, wherein the output signal is generated so that the potential of the output signal is always higher or always lower than a potential of the node when no input signal is applied to the node or the node is in a virtually open state; and
    configuring a feedback path through which the output signal is positive-feedbacked to the node.

2. The method according to claim 1, wherein the inverting step comprises:
    configuring a first inverter circuit with a transistor and a pair of power source terminals including a high-voltage terminal and a low-voltage terminal.

3. The method according to claim 2, wherein the generating step comprises:
    configuring a second inverter circuit to include a first transistor coupled between the high-voltage terminal and the node, the first transistor being in an OFF-state when the output of the first inverter circuit is at the H level and being in an ON-state when the output of the first inverter circuit is at the L level, and serially interposing second and third transistors between the low-voltage terminal and the node,
    wherein at least one of the second and third transistors is in an OFF-state when the output of the first inverter circuit is at the L level, and at least one of the second and third transistors is in the OFF-state when the output of the first inverter circuit is at the H level, and
    wherein when the potential of the input signal applied to the node is the H level potential, the second and third transistors output a potential equal to or higher than the potential of the input signal, and when the potential of the input signal is other than the H level potential, the second and third transistors output a potential higher than the potential of the input signal.

4. The method according to claim 3, further comprising the step of reducing a potential of the output signal of the first inverter circuit with respect to the input signal having the L level which is applied through the node so that the potential of the output signal of the first inverter circuit becomes lower than the H level to such an extent that the first transistor in the second inverter circuit is not turned on.

5. The method according to claim 4, further comprising the step of supplying a fixed current in a direction from the high-voltage terminal to the node or from the node to the low-voltage terminal.

6. The method according to claim 5, further comprising the step of limiting current flowing through the feedback path.

7. The method according to claim 4, further comprising the step of limiting current flowing through the feedback path.

8. The method according to claim 3, further comprising the step of supplying fixed current in a direction from the high-voltage terminal to the node or from the node to the low-voltage terminal.

9. The method according to claim 8, further comprising the step of limiting current flowing through the feedback path.

10. The method according to claim 3, further comprising the step of limiting current flowing through the feedback path.

11. The method according to claim 2, wherein the generating step comprises:
    configuring a second inverter circuit to include a first transistor coupled between the low-voltage terminal and the node, the first transistor being in an OFF-state when the output of the first inverter circuit is at the L level and being in an ON-state when the output of the first inverter circuit is at the H level, and serially interposing second and third transistors between the high-voltage terminal and the node,
    wherein at least one of the second and third transistors is in an OFF-state when the output of the first inverter circuit is at the L level, and at least one of the second and third transistors is in the OFF-state when the output of the first inverter circuit is at the H level, and
    wherein when a potential of the input signal applied to the node is the L level potential, the second and third transistors output an output signal having a potential equal to or lower than the potential of the input signal, and when the potential of the input signal is other than the L level potential, the second and third transistors output an output signal having a potential lower than the potential of the input signal.

12. The method according to claim 11, further comprising the step of raising a potential of the output signal of the first inverter circuit with respect to the input signal having the H level which is applied through the node so that the potential of the output signal of the first inverter circuit becomes higher than the L level to such an extent that the first transistor in the second inverter circuit is not turned on.

13. The method according to claim 12, further comprising the step of supplying a fixed current in a direction from the high-voltage terminal to the node or from the node to the low-voltage terminal.

14. The method according to claim 12, further comprising the step of limiting current flowing through the feedback path.

15. The method according to claim 11, further comprising the step of supplying a fixed current in a direction from the high-voltage terminal to the node or from the node to the low-voltage terminal.

16. The method according to claim 11, further comprising the step of limiting current flowing through the feedback path.

17. The method according to claim 1, further comprising the step of supplying a fixed current in a direction from the high-voltage terminal to the node or from the node to the low-voltage terminal.

18. The method according to claim 17, further comprising the step of limiting current flowing through the feedback path.

19. The method according to claim 1, further comprising the step of limiting current flowing through the feedback path.

* * * * *